United States Patent
Ando et al.

(10) Patent No.: US 10,790,445 B2
(45) Date of Patent: Sep. 29, 2020

(54) PROTUBERANT CONTACTS FOR RESISTIVE SWITCHING DEVICES

(71) Applicant: International Business Machines Corporation, Armonk, NY (US)

(72) Inventors: Takashi Ando, Tuckahoe, NY (US); Chih-Chao Yang, Glenmont, NY (US); Lawrence A. Clevenger, Saratoga Springs, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/252,774

(22) Filed: Jan. 21, 2019

(65) Prior Publication Data

US 2019/0207110 A1 Jul. 4, 2019

Related U.S. Application Data

(62) Division of application No. 15/861,158, filed on Jan. 3, 2018.

(51) Int. Cl.
*H01L 45/00* (2006.01)
*H01L 27/24* (2006.01)
*G11C 13/00* (2006.01)

(52) U.S. Cl.
CPC ...... *H01L 45/1253* (2013.01); *G11C 13/0007* (2013.01); *H01L 27/2463* (2013.01);
(Continued)

(58) Field of Classification Search
CPC ........................ H01L 45/1253; H01L 45/145
See application file for complete search history.

(56) References Cited

U.S. PATENT DOCUMENTS

| 6,538,214 B2 | 3/2003 | Khandros |
| 8,115,586 B2 | 2/2012 | Hosoi et al. |

(Continued)

FOREIGN PATENT DOCUMENTS

JP 2013069753 A 4/2013

OTHER PUBLICATIONS

Electronic Materials Research Laboratory, "Redox-based Tera-bit memories," http://www.emrl.de/r_a_1.html (retrieved Jan. 3, 2018), 10 pages.

(Continued)

*Primary Examiner* — Farun Lu
(74) *Attorney, Agent, or Firm* — Cantor Colburn LLP; Vazken Alexanian

(57) ABSTRACT

Embodiments of the invention are directed to a resistive switching device (RSD) that includes a first terminal, a second terminal, an active region having a switchable conduction state, and a protuberant contact communicatively coupled to the first terminal. The protuberant contact is configured to communicatively couple the first terminal through a first barrier liner to a first electrode line of a crossbar array. In embodiments of the invention, the protuberant contact is positioned with respect to the first barrier liner such that the first barrier liner does not impacting the switchable conduction state of the active region. In embodiments of the invention, the protuberant contact is positioned with respect to the first barrier liner such that the first barrier liner does not directly contact the first terminal.

13 Claims, 8 Drawing Sheets

(52) U.S. Cl.
CPC .......... *H01L 45/04* (2013.01); *H01L 45/1233* (2013.01); *H01L 45/146* (2013.01); *H01L 45/16* (2013.01); *H01L 45/1608* (2013.01); *G11C 13/004* (2013.01); *G11C 13/0023* (2013.01); *G11C 13/0069* (2013.01); *G11C 2013/0078* (2013.01); *G11C 2213/15* (2013.01); *G11C 2213/32* (2013.01); *G11C 2213/51* (2013.01); *G11C 2213/52* (2013.01); *G11C 2213/77* (2013.01)

(56) References Cited

U.S. PATENT DOCUMENTS

| | | |
|---|---|---|
| 8,742,391 B2 | 6/2014 | Mizushima et al. |
| 2006/0019510 A1 | 1/2006 | Rudduck et al. |
| 2013/0062588 A1* | 3/2013 | Sakotsubo .......... G11C 13/0004 257/4 |
| 2016/0155686 A1 | 6/2016 | Lee et al. |
| 2017/0092850 A1* | 3/2017 | Lee .......................... H01L 43/12 |
| 2018/0211913 A1* | 7/2018 | Lee ...................... H01L 23/5256 |

OTHER PUBLICATIONS

Wong et al., "Metal-Oxide RRAM," Proceedings of the IEEE, vol. 100, No. 6, Jun. 2012, pp. 1951-1970.
Ando et al., "Protuberant Contacts for Resistive Switching Devices," U.S. Appl. No. 15/861,158, filed Jan. 3, 2018.
List of IBM Patents or Patent Applications Treated as Related; Date Filed: Jan. 21, 2019, 2 pages.
Ando et al., "Protuberant Contacts for Resistive Switching Devices," U.S. Appl. No. 16/688,500, filed Nov. 19, 2019.
List of IBM Patents or Patent Applications Treated as Related; Date Filed: Nov. 19, 2019, 2 pages.

\* cited by examiner

PROTUBERANT CONTACTS FOR RESISTIVE SWITCHING DEVICES

DOMESTIC PRIORITY

This application is a divisional of U.S. patent application Ser. No. 15/861,158, filed Jan. 3, 2018, the disclosure of which is incorporated by reference herein in its entirety.

BACKGROUND

The present invention relates in general to resistive switching devices (RSDs). More specifically, the present invention relates to fabrication methodologies and resulting structures for forming protuberant contacts that communicatively couple an RSD to a conductive row/column electrode line of a crossbar array without degrading RSD performance.

Resistive random access memory (RRAM) is a nano-scale non-volatile memory (NVM). RRAM provides simple storage cell components, high density, low power, large endurance, fast write, read and erase speeds, and excellent scalability. A typical RRAM storage cell is two-terminal device formed as a metal-insulator-metal (MIM) structure. The insulator material can be a binary metal oxide, which makes the MIM storage cell compatible with silicon-based CMOS (complementary metal oxide semiconductor) fabrication process. When a sufficient electrical signal is applied across the metal electrodes of a MIM, the resistance of the insulator can be switched from one resistance state to another. The insulator retains its current resistance state until an appropriate electrical signal is applied across the metal electrodes to change it.

RRAM, along with the logic circuitry used to address, read and write individual RRAM cells, can be implemented in a crossbar array, which is compatible with a variety of electronic circuits and devices, including neuromorphic architectures. A basic crossbar array includes a set of conductive row electrode lines and a set of conductive column electrode lines formed to intersect the set of conductive row electrode lines. The intersections between the two sets of electrode lines are separated by a so-called "cross-point" device, which, in memory circuits, can be implemented as an RSD.

SUMMARY

Embodiments of the invention are directed to a resistive switching device (RSD) that includes a first terminal, a second terminal, an active region having a switchable conduction state, and a protuberant contact communicatively coupled to the first terminal. The protuberant contact is configured to communicatively couple the first terminal through a first barrier liner to a first electrode line of a crossbar array. In embodiments of the invention, the protuberant contact is positioned with respect to the first barrier liner such that the first barrier liner does not impacting the switchable conduction state of the active region. In embodiments of the invention, the protuberant contact is positioned with respect to the first barrier liner such that the first barrier liner does not directly contact the first terminal.

Embodiments of the invention are directed to a crossbar array that includes a set of conductive row electrode line and a set of conductive column electrode lines. The conductive column electrode lines are configured to form a plurality of crosspoints at intersections between the set of conductive row electrode lines and the set of conductive column electrode lines. The crossbar array further includes a RSD at each of the plurality of crosspoints. The RSD includes a first terminal, a second terminal, an active region having a switchable conduction state, and a protuberant contact communicatively coupled to the first terminal. The protuberant contact is configured to communicatively couple the first terminal through a first barrier liner to a first one of the set of conductive row electrode lines. In embodiments of the invention, the protuberant contact is positioned with respect to the first barrier liner such that the first barrier liner does not impacting the switchable conduction state of the active region. In embodiments of the invention, the protuberant contact is positioned with respect to the first barrier liner such that the first barrier liner does not directly contact the first terminal.

Embodiments of the invention are directed to a method of forming a crossbar array. The method includes forming a set of conductive row electrode lines and forming a conductive set of column electrode lines. The set of conductive column electrode lines are configured to form a plurality of crosspoints at intersections between the set of conductive row electrode lines and the set of conductive column electrode lines. The method further includes forming an RSD at each of the plurality of crosspoints, wherein the RSD includes a first terminal, a second terminal, an active region having a switchable conduction state, and a protuberant contact communicatively coupled to the first terminal. The method further includes configuring the protuberant contact to communicatively couple the first terminal through a first barrier liner to a first one of the set of conductive row electrode lines. In embodiments of the invention, the method further includes positioning the protuberant contact with respect to the first barrier liner such that the first barrier liner does not impact the switchable conduction state of the active region. In embodiments of the invention, the method further includes positioning the protuberant contact with respect to the first barrier liner such that the first barrier liner does not directly contact the first terminal.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Figure 1B:
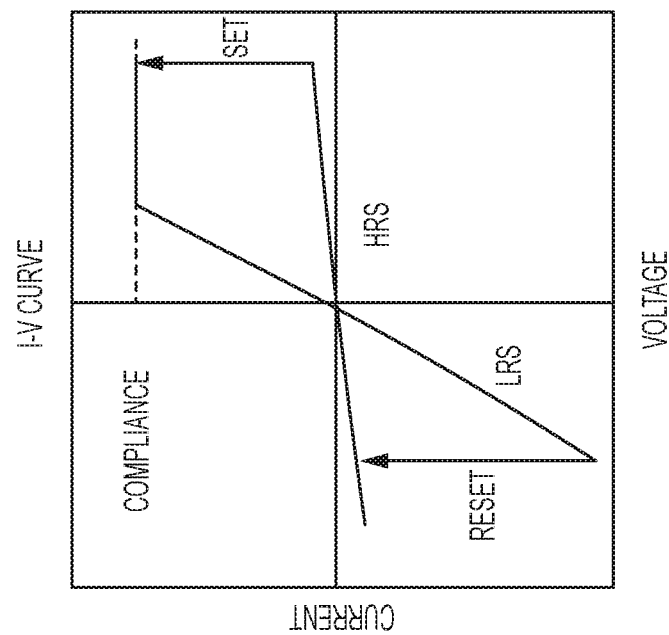
FIG. 1B depicts a diagram of an I-V curve illustrating the switching operation of the RSD component shown in FIG. 1A.

It is understood in advance that, although this description includes a detailed description of the formation and resulting structures for a specific type of RSD, implementation of the teachings recited herein are not limited to a particular type of RSD or IC architecture. Rather embodiments of the present invention are capable of being implemented in conjunction with any other type of RSD (e.g., phase change memory, spin-transfer torque memory, and the like) or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, with the growth of digital data applications, there is a need for increasingly fast and scalable memory technologies for data storage and data-driven computation. RRAM is a high speed, high density, and low fabrication cost NVM technology. Thus, RRAM has the potential to replace and/or complement the limited scaling of flash memories and other silicon-based memories such as dynamic random access memory (DRAM) and static random access memory (SRAM).

A typical RRAM storage cell is a two-terminal device formed as a metal-insulator-metal (MIM) structure, which is a simpler construction than the three terminal storage cells used in conventional CMOS-based DRAM or flash memory. The insulator material in the MIM can be a binary metal oxide, which makes fabricating a MIM RRAM storage cell compatible with silicon-based CMOS fabrication process. The resistance of an RRAM storage cell serves as the switchable conduction state that stores data. The resistance can be changed by electrical pulses that change the state of the conductive filament (CF) within the binary metal oxide.

Because each RRAM storage cell uses only two external terminals, these memories can be accommodated in a crossbar array, which is compatible with a variety of electronic circuits and devices, including ultra-high density NVM and artificial neural network (ANN) architectures. ANNs can be embodied in so-called "neuromorphic" microchips and architectures. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as ANNs carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

A basic crossbar array includes a set of conductive row electrode lines and a set of conductive column electrode lines formed to intersect the set of conductive row electrode lines. The intersections between the two sets of electrode lines are separated by a so-called "cross-point" device, which, in RRAM memory circuits, can be implemented as a two-terminal MIM RSD. The conduction state (e.g., resistance) of the MIM insulator can be altered by controlling the voltages applied between individual electrode lines of the row and column electrode lines. Digital data can be stored by alteration of the insulator material's conduction state at the intersection to achieve a high conduction state (or low resistance state (LRS)) or a low conduction state (or high resistance state (HRS)). The MIM insulator material can also be programmed to maintain two or more distinct conduction states by selectively setting the conduction state of the material. The conduction state of the memristor material can be read by applying a voltage across the material and measuring the current that passes through the target crosspoint device.

Thus, RRAM is a promising technology for neuromorphic computing. More specifically, an RSD storage cell can be used as a connection (synapse) between a pre-neuron and a post-neuron, thus representing the connection weight in the form of device resistance. Multiple pre-neurons and post-neurons can be connected through a crossbar array of RRAMs, which naturally expresses a fully-connected neural network. In order to make a large scale crossbar array, the electrode line resistance needs to be minimized in order to accurately read the voltage drop across the electrode line. Accordingly, the electrode lines of an RRAM crossbar array is typically formed from copper (Cu), and the RRAM MIM stack typically includes TiN electrodes for compatibility with CMOS fabrication processes.

A shortcoming of known RRAM fabrication processes is that using an additive patterning damascene process to form the Cu electrode lines of the RRAM crossbar array requires a relatively thick (e.g., from about 10 nm to about 50 nm) additional metal region (e.g. TaN), which is known as a thick barrier metal region, on top of the RRAM stack to protect it during the various damascene fabrication processes (e.g., during removal of a hardmask (e.g., TiN)). The thick barrier metal region, in known fabrication operations, remains in the final device. The required thick barrier metal region on top of the RRAM stack working in concert with a thinner barrier liner around the Cu electrode line is known to negatively impact RSD performance by changing the MIM storage cell's switching behavior below tolerable levels. In some circumstances, the MIM storage cell performance damage resulting from the barrier metal region and barrier liner can be significant enough that yield can be lost. The thick barrier region's negative impact on RSD switching performance can be mitigated to some degree by reducing the barrier region's thickness. However, the protection function of the barrier region is reduced below acceptable levels if the barrier region is not sufficiently thick.

Turning now to an overview of aspects of the present invention, embodiments of the invention address the shortcomings of the prior art by providing fabrication methodologies and resulting structures for forming protuberant contacts that communicatively couple an RSD to the conductive row/column electrode line of a crossbar array while preventing the metallic barrier liners around the conductive row/column electrode line from contacting the RSD and degrading RSD switching performance. In embodiments of the invention, a relatively thick sacrificial barrier metal region is used to protect the MIM stack of the RSD during certain fabrication processes. However, when the protection function has been completed, the thick sacrificial barrier metal region is removed, and a protuberant contact is grown over the MIM in the space that was occupied by the removed thick sacrificial barrier metal region.

Even without the relatively thick sacrificial barrier metal region in place, embodiments of the invention ensure that the barrier liner that surrounds row/column electrode lines does not interfere with RSD switching performance by configuring the protuberant contact to prevent the barrier liner around the electrode line from contacting the MIM of the RSD. Accordingly, because the protuberant contact according to embodiments of the invention replaces the relatively thick sacrificial barrier region and does not allow the remaining barrier metal liner to directly contact the MIM electrode, the thickness of the barrier metal region can be determined based on the required protection function during damascene fabrication of the Cu electrode lines, and the thickness of the barrier metal does not need to take into account any negative impact of the barrier metal region on RSD switching. According to embodiments of the invention, the thickness of the barrier metal region can be from about 10 nm to about 50 nm without degrading RSD switching performance. According to embodiments of the invention, the thickness of the barrier metal liner can be from about 2 nm to about 10 nm without degrading RSD switching performance.

Figure 1A:
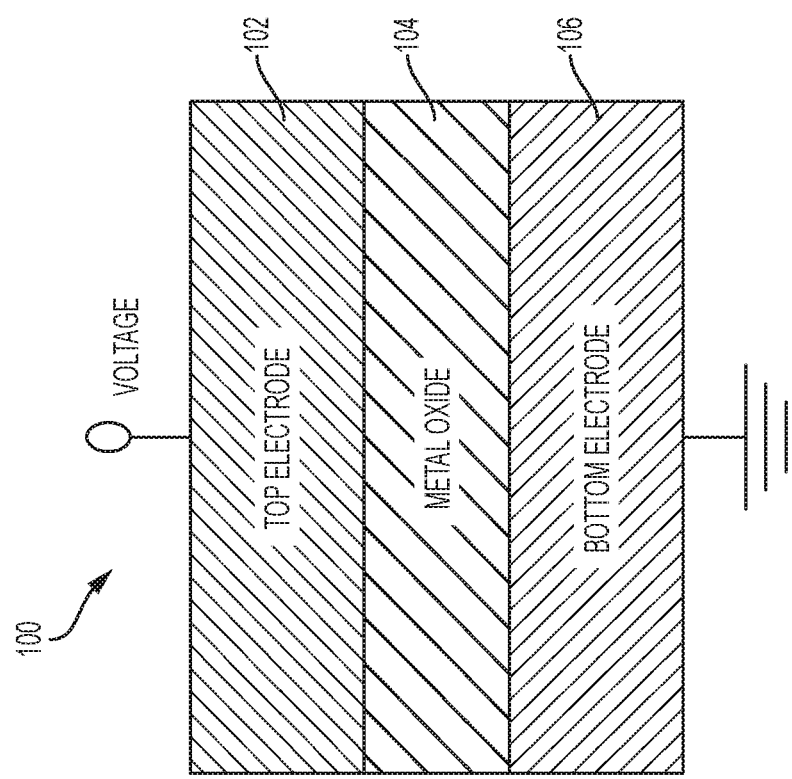
FIG. 1A depicts a simplified block diagram illustrating a cross-sectional view of a two-terminal resistive switching device (RSD), which can be used as a storage cell of an RRAM structure capable of incorporating aspects of the invention.

Turning now to a more detailed description of example embodiments of the invention, FIG. 1A depicts a simplified block diagram illustrating a cross-sectional view of a two-terminal RSD component 100, which can be used as a storage cell of an RRAM structure (e.g., crossbar array 200 shown in FIG. 2) capable of incorporating aspects of the invention. The RSD storage cell 100 includes a top electrode 102, metal oxide active region 104, and a bottom electrode 106, configured and arranged as shown. When a sufficient electrical signal (e.g., a voltage) is applied across the top/bottom electrodes 102, 106, the resistance of the metal oxide 104 can be switched from one resistance state to another. The metal oxide 104 retains its current resistance state until an appropriate electrical signal is applied across the top/bottom electrodes 102, 106 to change it.

FIG. 1B depicts a diagram of an I-V curve illustrating the switching operation of the RSD storage cell 100. The operation principle of the RSD storage cell 100 is based on the reversible resistive switching (RS) between at least two stable resistance states, namely the high resistance state (HRS) and low resistance state (LRS), which occur in the metal oxide 104. In general, the operation that changes the resistance of the storage cell 100 from a high resistance state (HRS) to a low resistance state (LRS) is called a SET process, while the opposite process is defined as a RESET process. The specific resistance state (HRS or LRS) can be retained after the electric stress is cancelled, which indicates the nonvolatile nature of RRAM. For an initial write operation, a voltage larger than the SET voltage is needed in order to "turn on" the resistive switching behaviors of the metal oxide 104 for the subsequent cycles. This is often referred to as the forming process or the electroforming process.

Based on the electrical polarity's relationship between the SET process and the RESET processes, the resistive switching behaviors of the storage cell 100 can be divided into two modes, which are known as a unipolar mode (not shown) and a bipolar mode (shown in FIG. 1B). In the unipolar switching mode, both SET and RESET transitions are achieved by applying electrical voltages of the same polarity (e.g., a positive voltage). In the bipolar switching mode, SET and RESET transitions are executed by applying voltages of opposite polarities (e.g., a positive voltage SET and a negative voltage RESET). In both cases, the current is limited by a compliance level during the abrupt set transition in order to suitably control the size of current conducting filament (CF) and the corresponding LRS resistance value.

Figure 2:
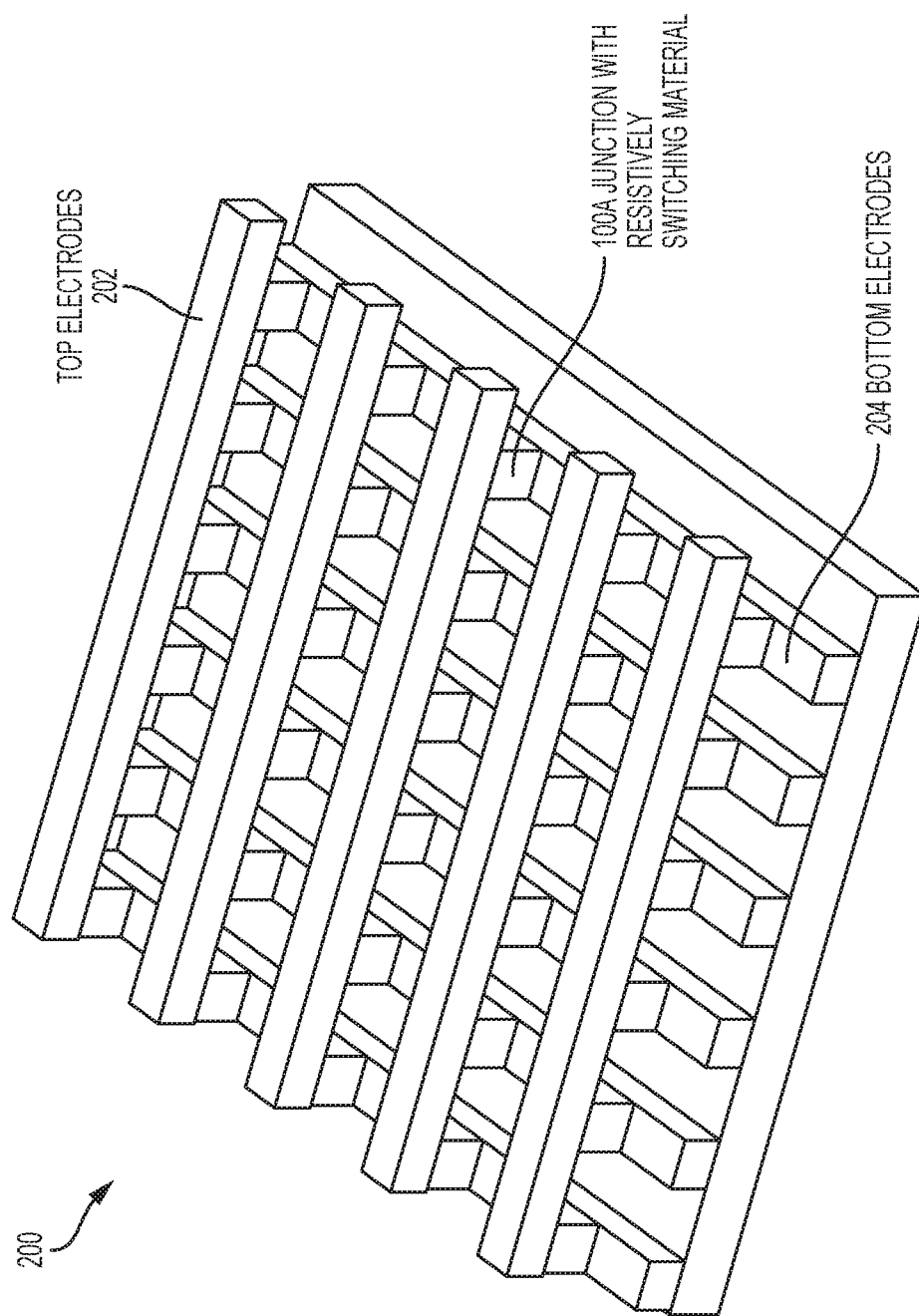
FIG. 2 depicts a simplified block diagram illustrating how the RSD component shown in FIG. 1A can be utilized as an addressable cross-point storage cell of an RRAM crossbar array capable of incorporating aspects of the invention.

FIG. 2 depicts a simplified block diagram illustrating how the RSD storage cell 100 shown in FIG. 1A can be utilized as an addressable cross-point storage cell 100A of an RRAM crossbar array 200 capable of incorporating aspects of the invention. The array 200 includes perpendicular conductive top electrode lines 202 (e.g., wordline rows), conductive bottom electrode lines 204 (e.g., bitline columns), and RSD memory cells 100A at the intersection between each top electrode line 202 and bottom electrode line 204. In embodiments of the invention, the storage cell 100A can be configured to operate the same as the storage cell 100 shown in FIG. 1A. Each storage cell 100A can be accessed for read and write by biasing the corresponding top electrode line 202 and bottom electrode line 204.

Figure 3:
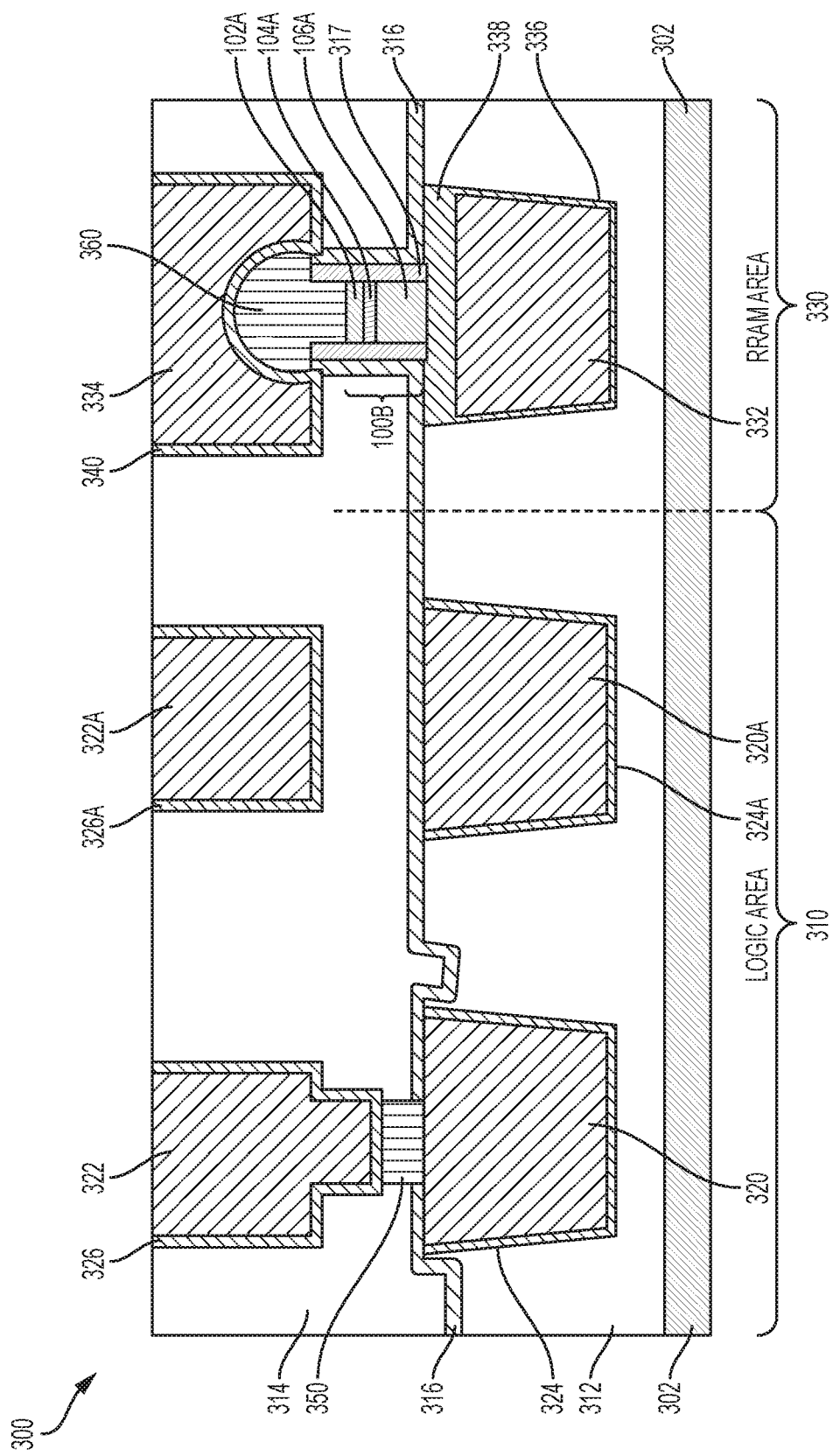
FIG. 3 depicts a cross-sectional view of a crossbar array incorporating aspects of the invention.

FIG. 3 depicts a cross-sectional view showing a simplified diagram of a crossbar array 300 incorporating aspects of the invention. The crossbar array 300 includes a substrate 302, a bottom interlayer dielectric (ILD) 312, a top ILD 314, a dielectric cap 316, a first set of bottom electrode lines 320, a second set of bottom electrode lines 320A, a third set of bottom electrode lines 332, a first barrier metal liner 324 surrounding each of the first set of bottom electrode lines 320, a second barrier metal liner 324A surrounding each of the second set of bottom electrode lines 320A, a third barrier metal liner 336 surrounding each of the third set of bottom electrode lines 332, a first set of top electrode lines 322, a second set of top electrode lines 322A, a third set of top electrode lines 334, a fourth barrier metal liner 326 surrounding each of the first set of top electrode lines 322, a fifth barrier metal liner 326A surrounding each of the second set of top electrode lines 322A, a sixth barrier metal liner 340 surrounding each of the third set of top electrode lines 334, a bottom barrier region 338, a metal cap 350, a protuberant contact 360, an RSD storage cell 100B, and an encapsulating layer 317 surrounding the storage cell 100B, configured and arranged as shown. In embodiments of the invention, the dielectric cap 316 and the encapsulating layer 317 can be a unitary, multilayered material.

The crossbar array 300 includes a logic area 310 and an RRAM area 330. In practice, the logic area 310 implements logic circuitry that can be configured to utilize the RRAM storage cells 100B. In embodiments of the invention, the logic area 310 includes circuitry configured to implement a trainable ANN or other computational neuromorphic circuitry. In embodiments of the invention, the logic area 310 includes circuitry configured to address, read and write RSD memory cells 100B in the RRAM area 330 of the crossbar array 300.

The crossbar array 300 is a simplified diagram. For example, the first set of bottom electrode lines 320 and the first set of top electrode lines 322 represent examples of the multiple top/bottom electrode pairs in the logic area 310 that are communicatively connected (e.g., through metal cap 350). The second set of bottom electrode lines 320A and the second set of top electrode lines 322A represent examples of the multiple top/bottom electrode pairs in the logic area 310 that are not communicatively connected. The third set of bottom electrode lines 332, RSD storage cell 100B, and third set of top electrode lines 334 represent one example of the multiple top/bottom electrode pairs and crosspoint devices in the RRAM area 330, which corresponds to the crossbar array 200 shown in FIG. 2.

In embodiments of the invention, the RSD storage cell 100B includes a top electrode 102A, metal oxide active region 104A, and a bottom electrode 106A, configured and arranged as shown. The RSD storage cell 100B operates in substantially the manner as the RSD storage cell 102A depicted in FIG. 1A. When a sufficient electrical signal (e.g., a voltage) is applied across the top/bottom electrodes 102A, 106A, the resistance of the metal oxide 104A can be switched from one resistance state to another. The metal oxide 104A retains its current resistance state until an appropriate electrical signal (e.g., from the logic area 310) is applied across the top/bottom electrodes 102A, 106A to change it.

In operation, the crossbar array 300, according to embodiments of the invention, address the shortcomings of the prior art by providing the protuberant contact 360, which is configured to communicatively couple the top electrode 102A to the third top conductive electrode line 334 while preventing the metallic barrier liner 340 around the third conductive electrode line 334 from contacting the top electrode 102A and degrading the switching performance of the RRAM storage cell 100B. In embodiments of the invention, and as described in greater detail subsequently herein, a relatively thick sacrificial barrier metal region 402 (shown in FIG. 4) is used to protect the storage cell 102B during certain fabrication processes. However, when the protection function has been completed, the thick sacrificial barrier metal region 402 is removed, and the protuberant contact 360 is grown over the top electrode 102A the space that was occupied by the removed thick sacrificial barrier metal region 402.

In addition to removing an impact from the relatively thick sacrificial barrier metal region 402 on the switching performance of the RSD storage cell 100B, embodiments of the invention ensure that the sixth barrier liner 340 that surrounds the third set of top conductive electrode lines 334 does not interfere with the switching performance of the storage cell 102B by configuring the protuberant contact 360 to prevent the sixth barrier liner 340 from contacting the top electrode 102A. Accordingly, because the protuberant contact 360 according to embodiments of the invention replaces the relatively thick sacrificial barrier region 402 (shown in FIG. 4) and does not allow the remaining sixth barrier liner 340 to directly contact the top electrode 102A, the thickness of the barrier metal region 402 can be determined based on the required protection function during damascene fabrication of the Cu electrode lines 320, 320A, 332, 322, 322A, 334, and the thickness of the barrier metal region 402 does not need to take into account any negative impact of the barrier metal region 402 on the switching performance of the storage cell 102B. According to embodiments of the invention, the thickness of the barrier metal region 402 can be from about 10 nm to about 50 nm without degrading the switching performance of the storage cell 102B. According to embodiments of the invention, the thickness of the barrier metal liner 402 can be from about 2 nm to about 10 nm without degrading the switching performance of the storage cell 102B.

FIGS. 4-8 depict cross-sectional views a crossbar array 300A after various fabrication operations according to embodiments of the invention. The crossbar array 300A, upon completion of the fabrication operations, will be the crossbar array 300 shown in FIG. 3.

Figure 4:
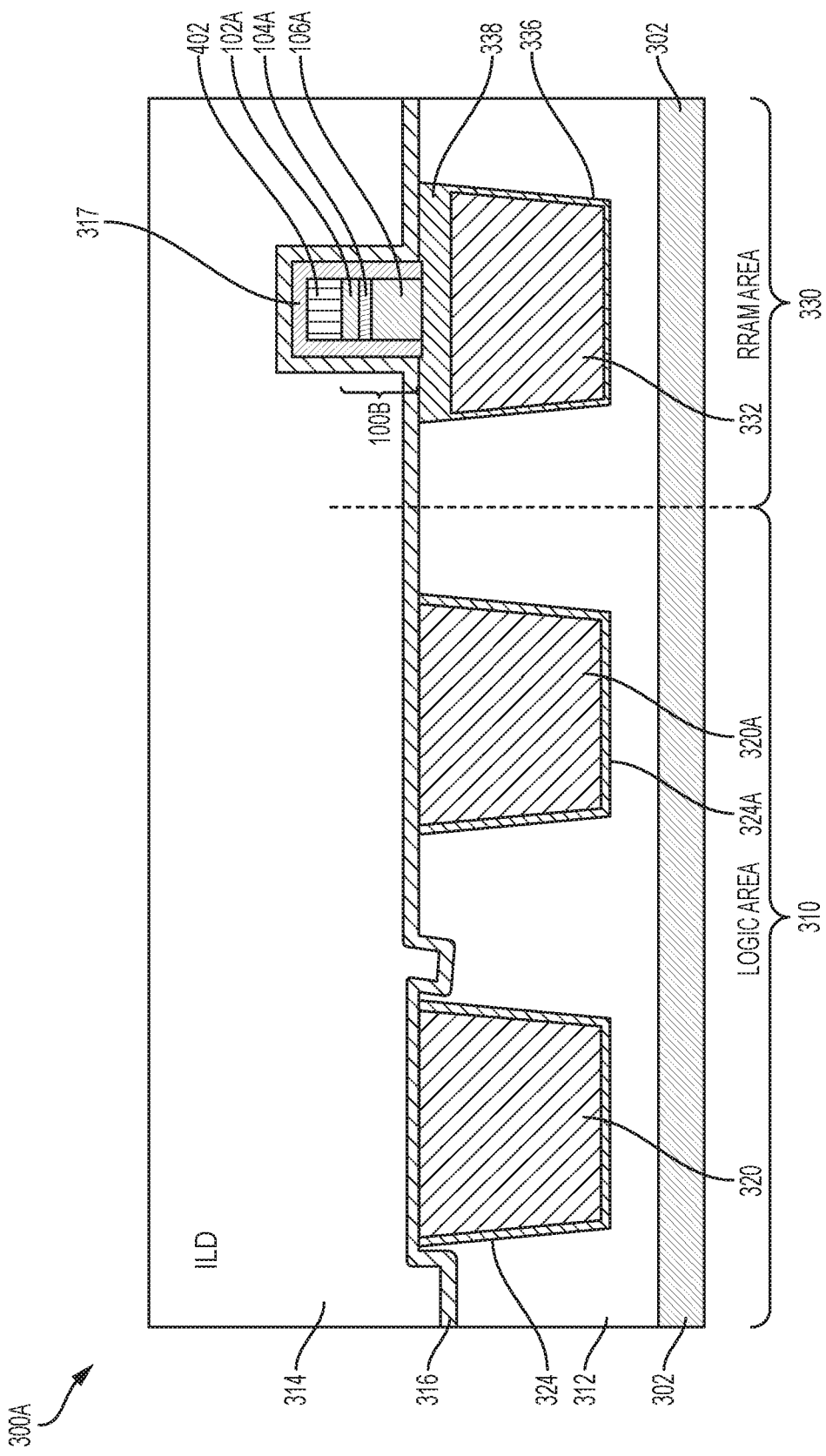
FIG. 4 depicts a cross-sectional view of a crossbar array after a fabrication operation according to aspects of the invention.

FIG. 4 depicts a cross-sectional view of the crossbar array 300A after an initial set of fabrication operations according to embodiments of the invention. As shown in FIG. 4, conventional semiconductor device fabrication processes have be implemented to form the substrate 302, the bottom ILD 312, the top ILD 314, the dielectric cap 316, the first set of bottom electrode lines 320, the second set of bottom electrode lines 320A, the third set of bottom electrode lines 332, the first barrier metal liner 324 surrounding each of the first set of bottom electrode lines 320, the second barrier metal liner 324A surrounding each of the second set of bottom electrode lines 320A, the third barrier metal liner 336 surrounding each of the third set of bottom electrode lines 332, the bottom barrier region 338, the metal cap 350, the RSD storage cell 100B, the barrier metal region 402, and the encapsulating layer 317, configured and arranged as shown.

Figure 5:
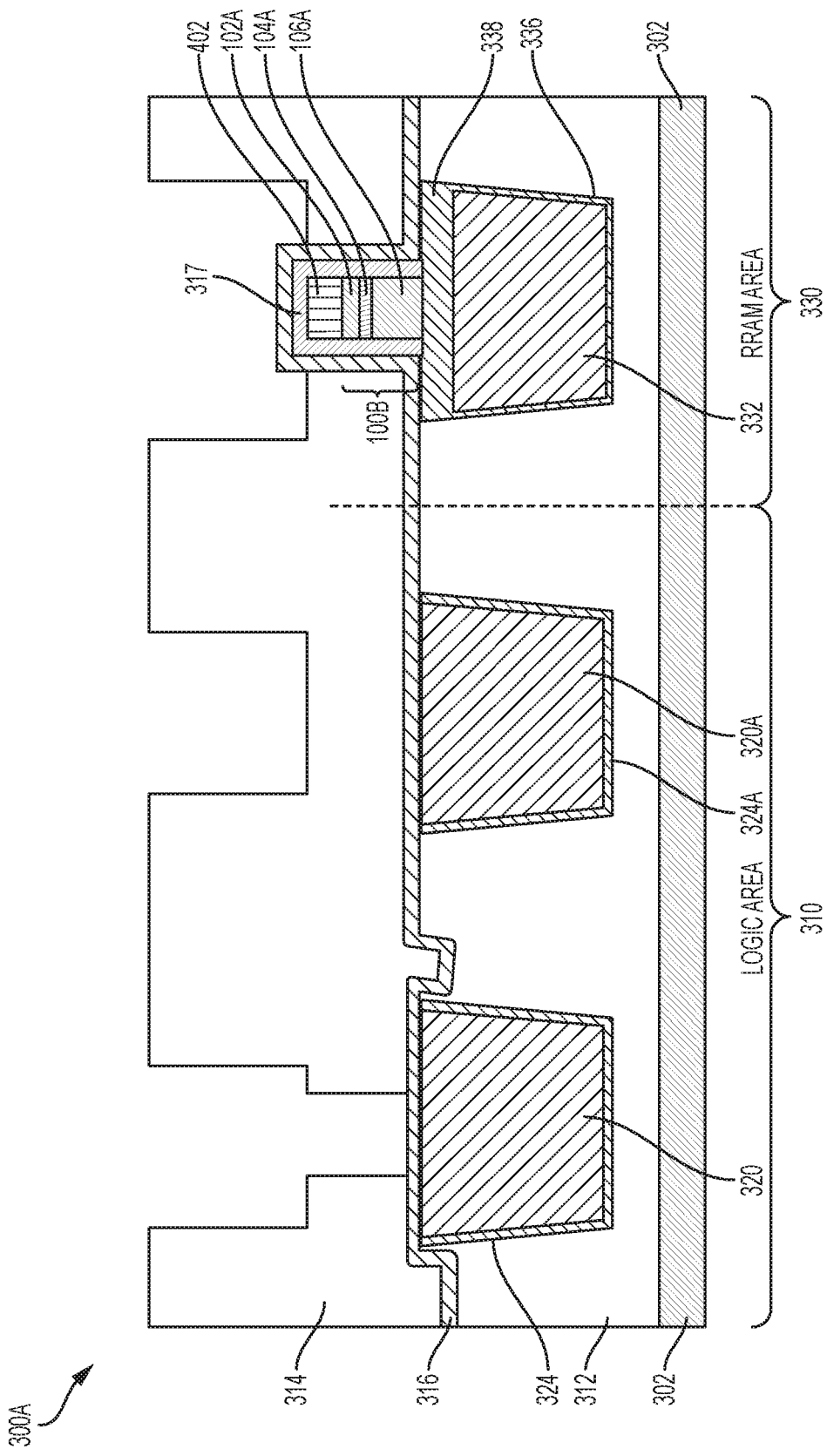
FIG. 5 depicts a cross-sectional view of a crossbar array after a fabrication operation according to aspects of the invention.

In FIG. 5, the top ILD 314 has been patterned and etched using conventional CMOS fabrication processes to remove selected portion of the top ILD 314.

Figure 6:
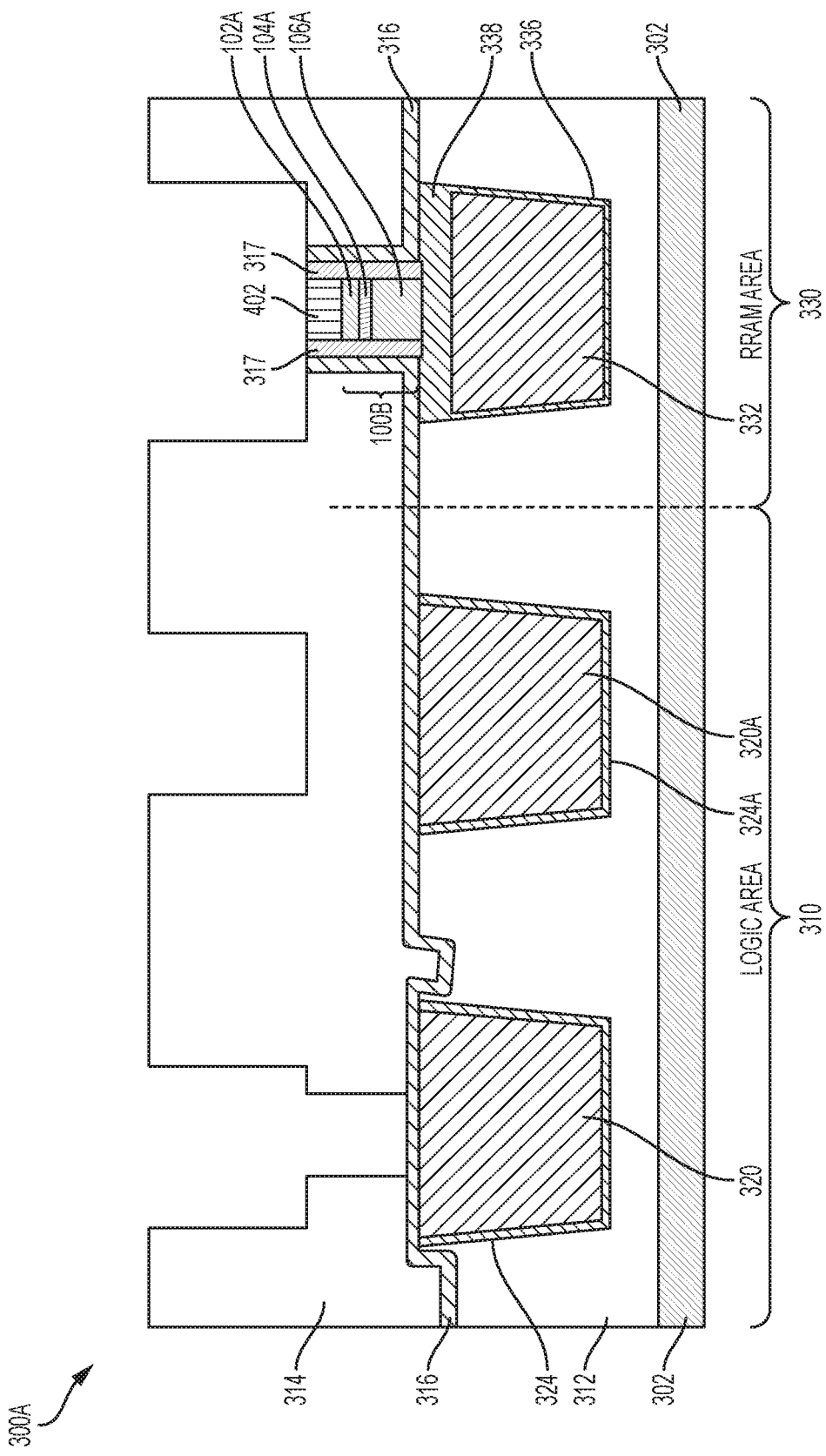
FIG. 6 depicts a cross-sectional view of a crossbar array after a fabrication operation according to aspects of the invention.

In FIG. 6, conventional CMOS fabrication processes have been used to remove top portions of the dielectric cap 316 and the encapsulating layer 317 that are over the barrier metal region 402. The barrier metal region 402 protects the storage cell 102B during removal of the top portions of the dielectric cap 316 and the encapsulating layer 317 that are over the barrier metal region 402.

Figure 7:
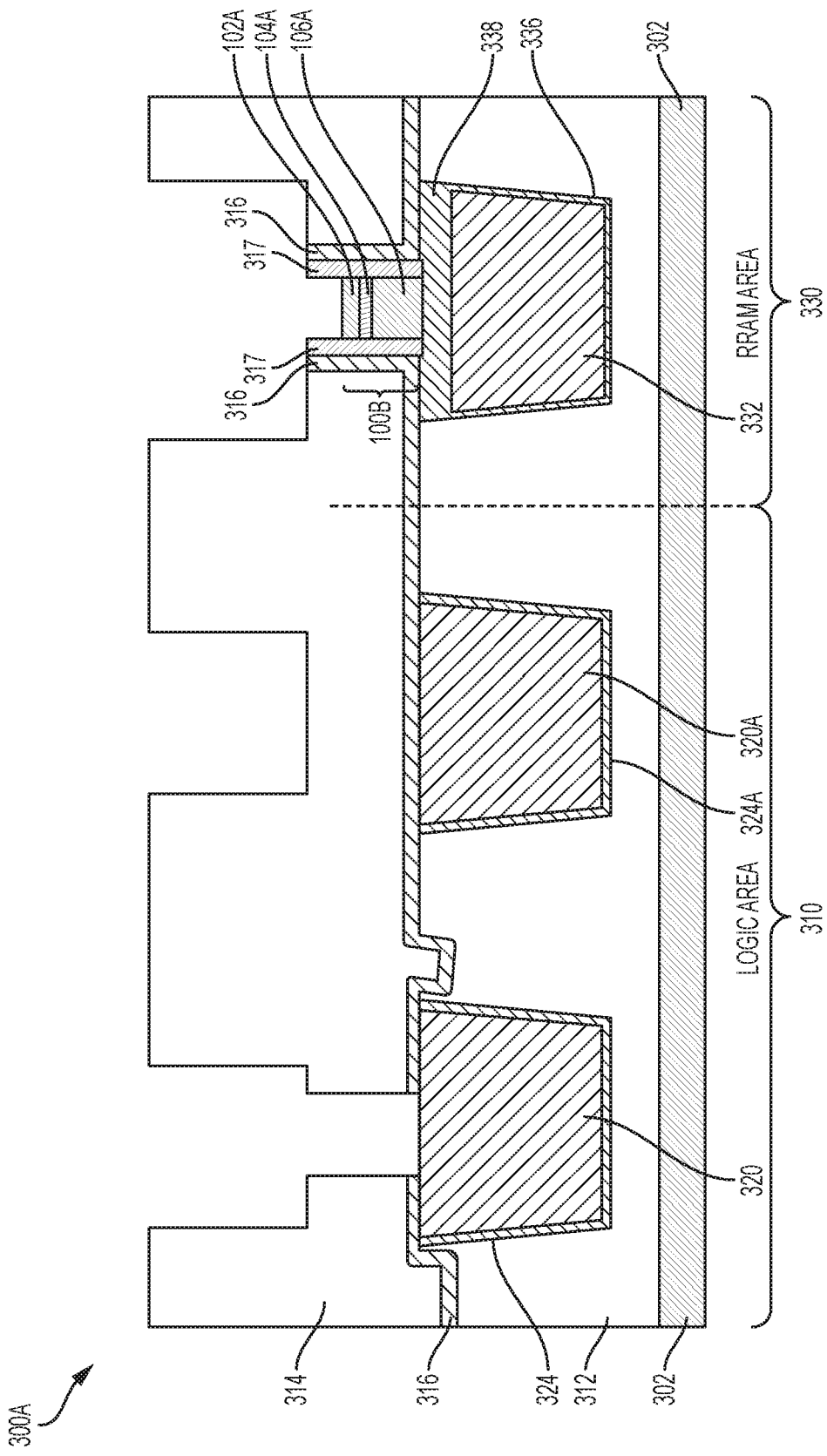
FIG. 7 depicts a cross-sectional view of a crossbar array after a fabrication operation according to aspects of the invention.

In FIG. 7, conventional CMOS fabrication processes have been used to remove the barrier metal region 402.

Figure 8:
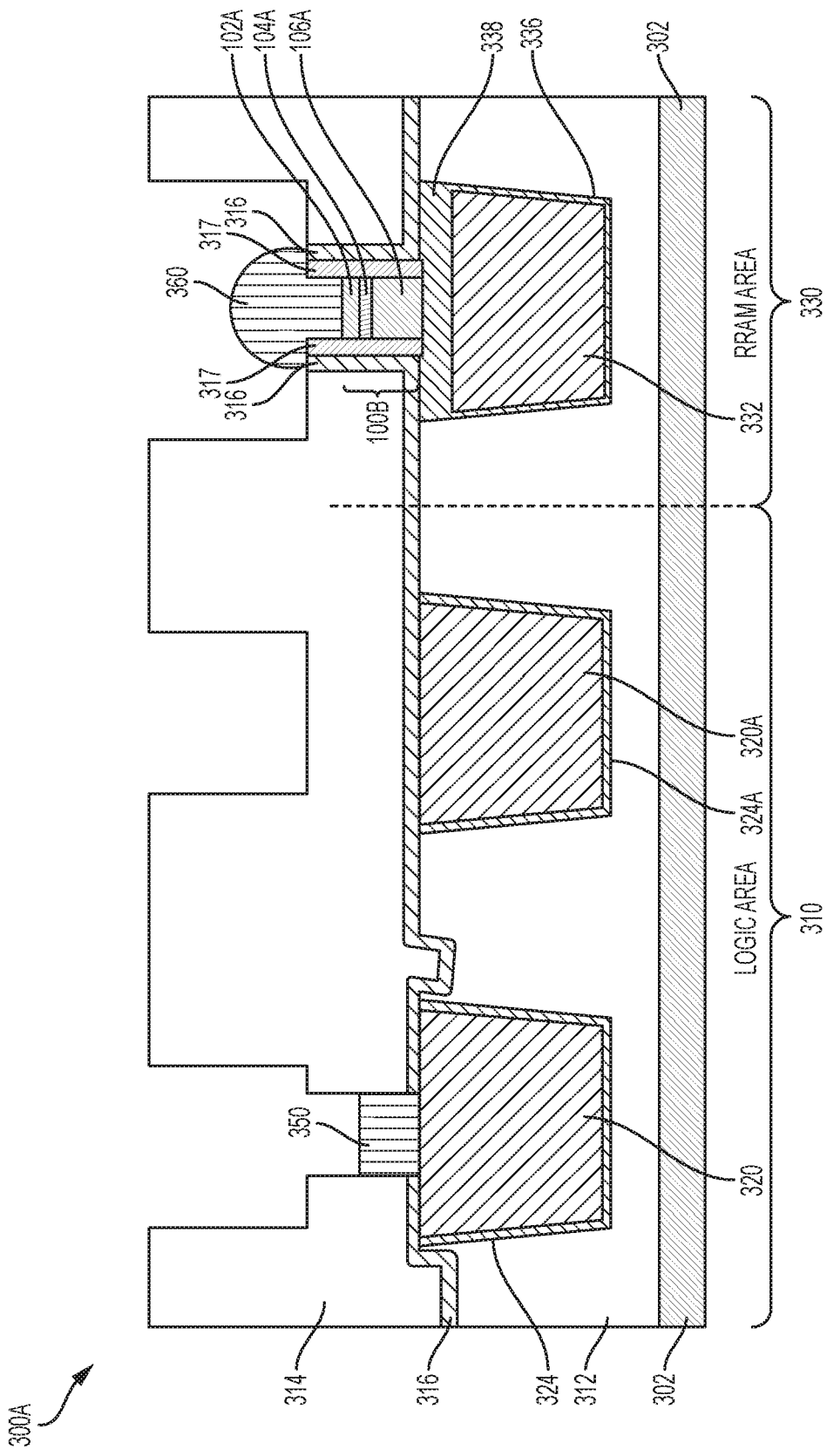
FIG. 8 depicts a cross-sectional view of a crossbar array after a fabrication operation according to aspects of the invention.

In FIG. 8, conventional CMOS fabrication processes have been used to form the metal cap region 350 over the first bottom conductive electrode line 320. Also, conventional CMOS fabrication processes have been used to form the protuberant contact 360 in the space that was occupied by the barrier metal region 402. In embodiments of the invention, the protuberant contact 360 is grown using a chemical vapor deposition (CVD) process. According to embodiments of the invention, the protuberant contact 360 is configured to communicatively couple the top electrode 102A to the third top conductive electrode line 334 (shown in FIG. 3) while preventing the metallic barrier liner 340 (shown in FIG. 3) around the third conductive electrode line 334 from contacting the top electrode 102A and degrading the switching performance of the RRAM storage cell 100B. In embodiments of the invention, the relatively thick sacrificial barrier metal region 402 (shown in FIG. 4) is used to protect the storage cell 102B during certain fabrication processes. However, when the protection function has been completed, the thick sacrificial barrier metal region 402 was removed, and the protuberant contact 360 has grown over the top electrode 102A the space that was occupied by the removed thick sacrificial barrier metal region 402.

In addition to removing an impact from the relatively thick sacrificial barrier metal region 402 on the switching performance of the RSD storage cell 100B, embodiments of the invention ensure that the sixth barrier liner 340 that surrounds the third set of top conductive electrode lines 334 does not interfere with the switching performance of the storage cell 102B by configuring the protuberant contact 360 to prevent the sixth barrier liner 340 from contacting the top electrode 102A. Accordingly, because the protuberant contact 360 according to embodiments of the invention replaces the relatively thick sacrificial barrier region 402 and does not allow the remaining sixth barrier liner 340 to directly contact the top electrode 102A, the thickness of the barrier metal region 402 can be determined based on the required protection function during damascene fabrication of the Cu electrode lines 320, 320A, 332, 322, 322A, 334, and the thickness of the barrier metal region 402 does not need to take into account any negative impact of the barrier metal region 402 on the switching performance of the storage cell 102B. According to embodiments of the invention, the thickness of the barrier metal region 402 can be from about 10 nm to about 50 nm without degrading the switching performance of the storage cell 102B. According to embodiments of the invention, the thickness of the barrier metal liner 402 can be from about 2 nm to about 10 nm without degrading the switching performance of the storage cell 102B.

After the fabrication operations shown in FIG. 8, conventional CMOS fabrication processes are used to have been used to form the final crossbar array 300 shown in FIG. 3 by forming the first set of top electrode lines 322, the second set of top electrode lines 322A, the third set of top electrode lines 334, the fourth barrier metal liner 326 surrounding each of the first set of top electrode lines 322, the fifth barrier metal liner 326A surrounding each of the second set of top electrode lines 322A, and the sixth barrier metal liner 340 surrounding each of the third set of top electrode lines 334.

The thicknesses of the respective components, layers, regions, etc. of the novel RRAM crossbar array 200 (shown in FIG. 2) described herein can vary according to design considerations. For example, the thicknesses of the layers of the novel RSD storage cell 100, 100B can be designed to have predetermined thicknesses, to have thicknesses within predetermined ranges, to have thicknesses having fixed ratios with respect to each other, or to have thicknesses based on any other consideration or combination of considerations in accordance with the various functionalities described herein.

The materials used to form the respective components, layers, regions, etc. of the novel RRAM crossbar array 200 (shown in FIG. 2) described herein can vary according to design considerations. For example, the materials used to form the layers of the novel RSD storage cell 100, 100B can be selected based at least in part on predetermined material characteristics, material characteristics that occur within predetermined ranges, material characteristics having fixed performance relationships with respect to each other, or to have material characteristics based on any other consideration or combination of considerations in accordance with the various functionalities described herein.

Notwithstanding the above, the following materials are contemplated for use in embodiments of the invention. The substrate 302 can be formed from silicon or any other suitable semiconductor material. The ILDs 312, 314 can be formed from a silicon dioxide based material or any other suitable dielectric. The dielectric cap 316 can be formed from silicon nitride or any other suitable dielectric. The bottom/top electrode lines 320, 320A, 332, 322, 322A, 334 can be formed from copper (Cu), suitable Cu alloys, or any other suitable conductive metal. The various barrier metal liners 324, 324A, 336, 326, 326A, 340 can be formed from Ta(N), Ti(N), C(N), Ru(N) or any other metallic or metallic alloy material. The bottom barrier region 338 can be formed from Ta(N), Ti(N), W, Co, Ru, and equivalents thereof. The metal cap 350 can be formed from W, Co, Ru, and equivalents thereof. The protuberant contact 360 can be formed from W, Co, Ru, and equivalents thereof. The encapsulating layer 317 can be formed from silicon nitride or any other suitable dielectric. The top electrode 102, 102A can be formed from Ti(N) and equivalents thereof. The metal oxide active regions 104, 104A can be formed from $HfO_x$, $TaO_x$, $TiO_x$, $AlO_x$, and equivalents thereof. The bottom electrode 106, 106A can be formed from Ta(N), Ti(N) and equivalents thereof.

The crossbar array 300 (shown in FIG. 3) can be fabricated in the back end of line (BEOL) at relatively low temperatures, which allows for easy integration with CMOS devices and stacking in 3D. Accordingly, the crossbar array 300 can be used not only for NVM, but also for computing memories, thereby allowing fast data access to overcome the bottlenecks that can occur in conventional von Neumann computing architectures, as well as for computing architectures blurring the distinction between memory circuits and computing circuits, such as nonvolatile memristive logic computation or neuromorphic networks (e.g., ANNs).

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/ connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A crossbar array comprising:
   a set of conductive row electrode lines;
   a set of conductive column electrode lines configured to form a plurality of crosspoints at intersections between the set of conductive row electrode lines and the set of conductive column electrode lines; and
   a resistive switching device (RSD) at each of the plurality of crosspoints;
   wherein the RSD comprises:
      a first terminal;
      a second terminal;
      an active region having a switchable conduction state; and
      a protuberant contact communicatively coupled to the first terminal;
      wherein the protuberant contact comprises a top protuberant portion positioned within a cavity formed through a surface of a first one of the set of conductive row electrode lines;
      wherein a width dimension of the top protuberant portion is greater than a width dimension of the first terminal, the second terminal, or the active region; and
      wherein the protuberant contact is configured to communicatively couple the first terminal through a first barrier liner to the first one of the set of conductive row electrode lines.

2. The crossbar array of claim 1, wherein the protuberant contact is positioned with respect to the first barrier liner such that the first barrier liner does not impact the switchable conduction state of the active region.

3. The crossbar array of claim 2, wherein the protuberant contact is positioned with respect to the first barrier liner such that the first barrier liner does not directly contact the first terminal.

4. The crossbar array of claim 3, wherein the second terminal is configured to communicatively couple through a second barrier liner to a second one of the set of conductive column electrode lines of the crossbar array.

5. The crossbar array of claim 4, wherein the protuberant contact comprises a material selected from the list consisting of W, Co, and Ru.

6. The crossbar array of claim 1, wherein the RSD is configured to perform a data storage operation.

7. The crossbar array of claim 6, wherein the data storage operation comprises a change in the switchable conduction state of the active region.

8. The crossbar array of claim 1, wherein the first terminal comprises a titanium-based material.

9. The crossbar array of claim 8, wherein the second terminal comprises a titanium-based material.

10. The crossbar array of claim 9, wherein the first barrier liner comprises tantalum nitride-based material.

11. The crossbar array of claim 4, wherein the second barrier liner comprises tantalum nitride-based material.

12. The crossbar array of claim 11, wherein the first one of the set of conductive row electrode lines comprises a copper-based material.

13. The crossbar array of claim 4, wherein a first one of the set of conductive column electrode lines comprises a copper-based material.

* * * * *